United States Patent [19]

Araps et al.

[11] Patent Number: 4,599,136
[45] Date of Patent: Jul. 8, 1986

[54] METHOD FOR PREPARATION OF SEMICONDUCTOR STRUCTURES AND DEVICES WHICH UTILIZE POLYMERIC DIELECTRIC MATERIALS

[75] Inventors: Constance J. Araps, Wappingers Falls; Steven M. Kandetzke, Fishkill; Ellen L. Kutner, Poughquag; Mark A. Takacs, Poughkeepsie, all of N.Y.

[73] Assignee: International Business Machines Corporation, Armonk, N.Y.

[21] Appl. No.: 657,277

[22] Filed: Oct. 3, 1984

[51] Int. Cl.[4] ............... H01L 21/306; B44C 1/22; C03C 15/00; C03C 25/06
[52] U.S. Cl. .................. 156/643; 29/576 W; 29/580; 29/591; 156/646; 156/648; 156/653; 156/655; 156/657; 156/659.1; 156/662; 156/668; 204/192 EC; 204/192 E; 357/49; 357/65; 427/93; 427/94
[58] Field of Search ............... 156/643, 646, 648, 653, 156/655, 657, 659.1, 662, 668; 29/576 W, 580, 591; 204/192 EC, 192 E; 357/49, 65; 427/38, 39, 93, 94

[56] References Cited

U.S. PATENT DOCUMENTS

| | | |
|---|---|---|
| 3,515,585 | 6/1970 | Chamberlin et al. |
| 3,700,497 | 10/1972 | Epifano et al. |
| 3,846,166 | 11/1974 | Saiki et al. |
| 3,985,597 | 10/1976 | Zielinski |
| 4,224,361 | 9/1980 | Romankiw |
| 4,256,816 | 3/1981 | Dunkleberger |
| 4,367,119 | 1/1983 | Logan et al. |
| 4,502,914 | 3/1985 | Trumpp et al. ............ 29/576 W |
| 4,532,696 | 8/1985 | Iwai ............ 29/580 X |

Primary Examiner—William A. Powell
Attorney, Agent, or Firm—Shirley Church Moore

[57] ABSTRACT

A method of fabrication of semiconductor structures which utilize trenches filled with polymeric dielectric materials to isolate segments thereof is disclosed. Contamination of the polymeric dielectric during processing of structural segments is avoided by filling the trenches with disposable polymer through formation of conductive patterns upon the structure, with subsequent removal of the disposable polymer and replacement with the desired polymeric dielectric.

19 Claims, 7 Drawing Figures

METHOD FOR PREPARATION OF SEMICONDUCTOR STRUCTURES AND DEVICES WHICH UTILIZE POLYMERIC DIELECTRIC MATERIALS

BACKGROUND OF THE INVENTION

The present invention relates to a method of preparing semiconductor structures and devices which utilize polymeric dielectric materials. In particular, the method permits fabrication of semiconductor structures bearing conductive patterns or connections and utilizing polymeric dielectrics such as polyimides.

Methods of manufacture of semiconductor devices are frequently comprised of a series of steps during which layers of various materials are applied to the semiconductor structure. Some of the layers remain as part of the device at the end of manufacture, while others are utilized as masking for subsequently applied layers and are removed prior to completion of manufacture. Frequently removal of a masking material is achieved by use of a solvent which dissolves the masking material while leaving surrounding materials, which are intended to be a permanent part of the semiconductor device, intact.

In some cases the materials which are intended to become a permanent part of the semiconductor device are sufficiently similar in nature to the masking materials that they are affected by the solvent used to remove the masking material. This is particularly true when polymeric materials are utilized both as permanent functional components and as masking materials. As a result, the polymeric materials intended to be a permanent functional part of the semiconductor device become contaminated with solvent used to remove the polymeric masking materials and do not function as intended. In addition, because the solvents used to remove the masking are frequently volatile, they tend to evaporate and migrate over time, so that the functioning of the polymeric materials within the device and thus the functioning of the device itself changes over time.

Examples of processes utilizing multi-layer material depositions and masking layers which are subsequently removed include U.S. Pat. No. 4,256,816 Dunkleberger, and U.S. Pat. No. 4,224,361 Romankiw (assigned to the assignee of the present invention). Interest in replacing traditional inorganic dielectric materials in semiconductor devices with polymeric materials, e.g. as device dielectric isolation layers, trench dielectric, and interlevel passivation layers, has been significant due to improved ease of fabrication and potentially better thermal and electrical properties obtainable when the polymeric materials are used. This interest is manifested in the form of U.S. patents which disclose the use of polyimides, polyimide-polyamide or like materials as insulating or passivating materials in electronic components. Among such patents are: U.S. Pat. No. 3,700,497 Epifano et al; U.S. Pat. No. 3,846,166 Saiki et al; U.S. Pat. No. 3,486,934 Bond; U.S. Pat. No. 3,515,585 Chamberlin et al; U.S. Pat. No. 3,985,597 Zielinski; and U.S. Pat. No. 4,367,119 Logan et al.

Due to the interest in using polymeric materials such as polyimides as dielectric materials in semiconductor devices, it is necessary to provide a method of preventing contamination of such polymeric materials by the solvents used in the fabrication process. The present invention solves this problem by providing for use of a substitute polymeric material as a space holder and surface protective entity during certain processing steps, with subsequent replacement of this substitute material using the desired polymeric dielectric.

SUMMARY OF THE INVENTION

In accordance with the invention, a method is provided for formation of conductive patterns and connections within semiconductor structures having segments thereof isolated from each other by dielectric-filled trenches in the structure. The dielectric material used to fill the trenches, as well as the interface between the dielectric and the trench surface, are protected from contamination by use of a space-holding substitute polymeric material during certain process steps. The substitute material is subsequently removed and replaced with the desired polymeric dielectric. The method of the present invention comprises:

(a) filling the trenches of a semiconductor structure with a removable polymeric underlay;

(b) performing intermediary processing steps upon the semiconductor structure;

(c) removing the polymeric underlay from the trenches of the semiconductor structure; and (d) refilling the trenches with a permanent polymeric dielectric material.

In one preferred embodiment, the space-holding substitute polymer is used during processing steps wherein deposition of a conductive pattern occurs, wherein the method of the invention comprises:

(a) coating the semiconductor structure and concurrently filling the trenches thereof with a layer of a removable lift-off polymeric underlay;

(b) forming a barrier film over the polymeric underlay;

(c) forming a mask/imaging layer over the barrier film, with the mask layer having a pattern of openings defining a desired conductive pattern;

(d) sequentially dry etching, through the openings in the mask, the barrier film and the polymeric underlay to the surface of the semiconductor structure;

(e) depositing a blanket layer of conductive material over any remaining mask layer, barrier film layer and on the exposed surfaces of the semiconductor structure;

(f) removing the polymeric underlay from the semiconductor structure and the trenches with concurrent complete removal of any barrier film layer and mask layer positioned over the polymeric underlay;

(g) filling the trenches and concurrently coating the semiconductor structure with a dielectric composition.

The preferred method of removing the polymeric underlay and barrier layer from the semiconductor structure in the patterned area of mask openings [step (d) above] is dry etching.

Additional process steps may be utilized to planarize the structure and to seal off the trench dielectric from ambient conditions, such steps comprising:

(h) planarizing the dielectric material to a level even with the surface of the semiconductor structure surrounding the trenches and simultaneously exposing the conductive pattern upon other portions of the semiconductor structure;

(i) blanket coating the semiconductor structure with exposed conductive pattern thereon with silicon nitride film;

(j) blanket coating the silicon nitride film with a layer of a silicon dioxide dielectric to a level above the conductive pattern; and (k) planarizing the silicon dioxide layer and the silicon nitride film by dry etching thereof to a level exposing the top surface portions of the conductive pattern.

The method of the present invention permits filling of the trenches (and subsequent encapsulation if desired) with the polymeric trench isolation dielectric without detrimental exposure of the polymeric dielectric to any harsh lift off solvents. The integrity of the polymeric isolation dielectric is thus preserved and performance of a semiconductor device utilizing the prepared substrate is not affected by contaminants.

The above and many other features and attendant advantages of the invention will become apparent as the invention becomes better understood by reference to the following accompanying drawings and detailed description.

DESCRIPTION OF THE PREFERRED EMBODIMENTS

Preparation of semiconductor structures which use trench isolation technology requires the use of a trench isolation dielectric. Polyimide has been used as the isolation dielectric with some success; however, if deposition of the polyimide is followed by process steps utilizing organic solvents, the polyimide can become contaminated by the solvents. In order to avoid such contamination of the polyimide dielectric, the process of the present invention provides for use of a removable lift-off underlay material as a space holder and surface protective entity during certain processing steps, with subsequent replacement of this lift-off underlay material with the polyimide dielectric.

Figure 1:
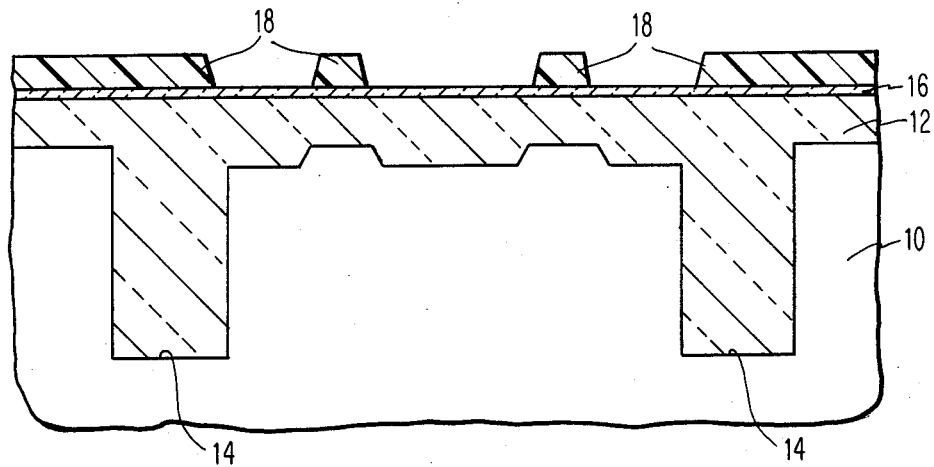
FIG. 1 is a diagramatic cross-sectional view of a semiconductor structure containing trenches with a layer of removable lift-off polymeric underlay covering the surface of the structure and filling the trenches. A barrier film is shown covering the upper surface of the polymeric underlay and a mask/imaging layer is shown upon the upper surface of the barrier film.

Referring to FIG. 1, the lift-off underlay material 12 is applied to the semiconductor structure to be processed 10 so that the isolation trenches 14 are filled and a planarized surface above the structure 10 is obtained. The lift-off underlay material may be comprised of any number of materials such as polysulfone, PMMA (polymethyl methacrylate), PMS (poly-α-methylstyrene) and diazoquinone-novolak compositions. Subsequent to application of the underlay 12, a dry etch barrier 16 is deposited upon the surface of the underlay 12. The barrier material may be comprised of materials such as organo-silicate glass, plasma HMDS (hexamethyl disilizane), and plasma DVS (divinylstyrene). An imaging photoresist layer 18 is then produced upon the surface of the barrier layer 16.

Figure 2:
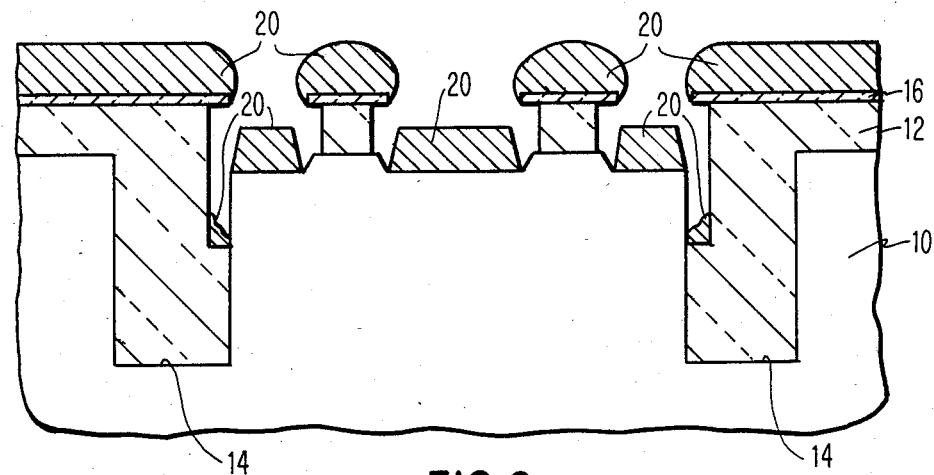
FIG. 2 is a view of the same semiconductor structure after dry etching through the barrier film and polymeric underlay in the area of the mask pattern, and subsequent application of a conductive layer over the surface of the barrier layer and the exposed surfaces of the semiconductor substrate. Note that the mask/imaging layer has been substantially removed during the same dry etch operation.

Reactive ion etching is then used to remove the barrier layer 16 and portions of the organic underlay 12 in areas which are not protected by the photoresist layer 18. During the etching procedure, substantially all of the photoresist layer 18 is also removed. A conductive layer is then deposited upon the overall surface structure, producing the composite shown in FIG. 2, wherein the conductive layer 20 may be comprised of a combination of materials such as chromium underlaid aluminum-copper alloy.

The remaining underlay material 12, barrier material 16 and conductive layer 20 which overlay the underlay material 12 are subsequently removed to produce the structure shown in FIG. 3, wherein only the structure 10 and portions of the conductive layer 20 remain. Removal of the organic underlay 12 and other layers supported by its presence (lift-off) is accomplished by dissolving away diazoquinone-novolak composition or polysulfone underlay using NMP (N-methyl-2-pyrrolidone) solvent, or by heating PMMA or PMS underlay to about 300° C. to depolymerize, and subsequently dissolving away the depolymerized PMMA or PMS using diglyme followed by toluene, or using any similar method appropriate to the underlay utilized.

Figure 3:
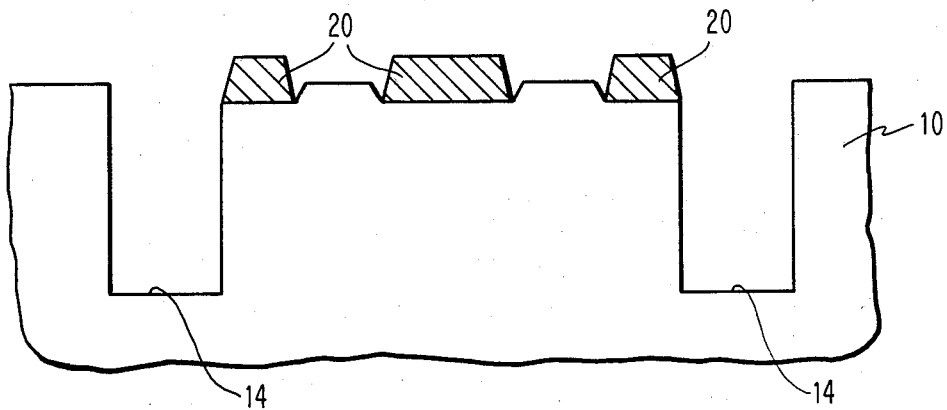
FIG. 3 is a view of the semiconductor structure after removal of the polymeric underlay from the semiconductor structure and the trenches, with concurrent complete removal of any barrier film layer and remaining imaging layer positioned over the polymeric underlay.
Figure 4:
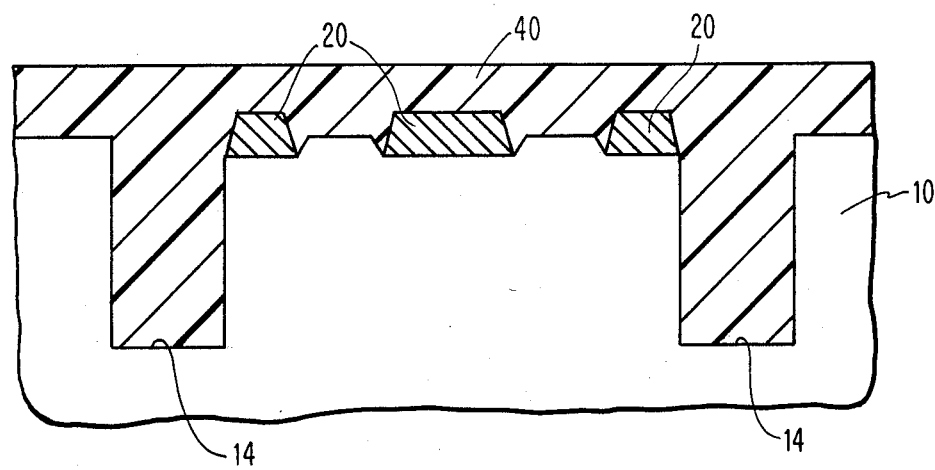
FIG. 4 is a view of the semiconductor structure after refilling of the trenches and concurrent coating of the semiconductor surface and accompanying conductive deposits with a polymeric dielectric material.

Once the structure shown in FIG. 3 is obtained, the trenches 14 are filled with the dielectric material 40, which is applied so that a planarized surface above the structure 10 and conductive layer pattern 20 is obtained, the trenches 14 are filled with the dielectric material 40, which is applied so that a planarized surface above the structure 10 and conductive layer pattern 20 is obtained as shown in FIG. 4. The dielectric material, such as polyimide, may be deposited from a solution or obtained via in situ cure of a polymerizable oligomer such as polyamic acid, the corresponding amic ester, the corresponding isoimide, the corresponding imide, analogues thereof, or mixtures thereof as described in U.S. patent application, Ser. No. 556,731, filed Nov. 30, 1983 and pending before the U.S. Patent and Trademark Office, (assigned to the assignee of the present invention). Planarization of the surface of the dielectric material 40 may be achieved by more than one application of the dielectric prior to final cure at temperatures ranging between 180° C. and 400° C., depending on the dielectric material used.

Figure 5:
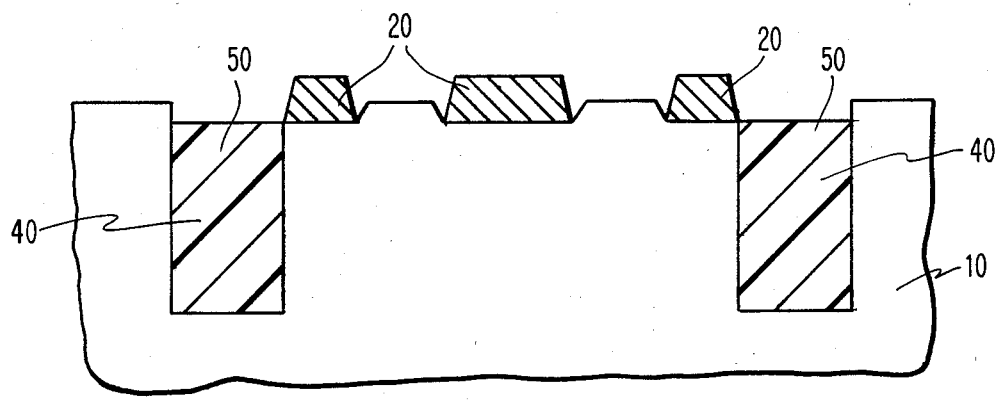
FIG. 5 shows the semiconductor structure after planarization of the dielectric material to a level even with the surface of the semiconductor substrate and exposure of the conducting pattern thereon.

Following planarization and final cure of the dielectric, the dielectric is then etched back as shown in FIG. 5, by a method such as oxygen RIE (reactive ion etching), to the trench surface 50, eliminating a sharp step over the trench to the dielectric and exposing the conductive layer pattern 20. A bake at about 300° C. may then be utilized to eliminate ambient moisture from the polyimide.

Figure 6:
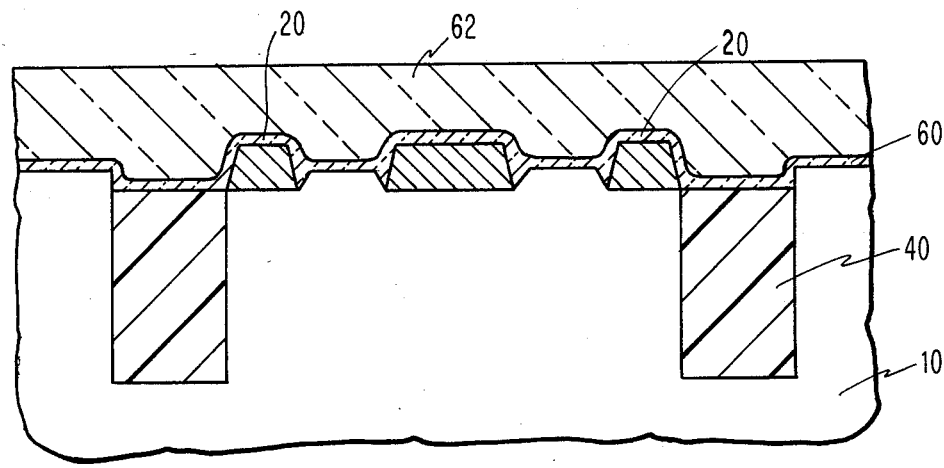
FIGS. 6 and 7 show possible additional process steps in which the dielectric trench material is sealed off from ambient conditions by first applying a layer of a barrier film followed by a layer of dielectric, with subsequent planarization of the dielectric to expose the top surface portions of the conductive pattern.
Figure 7:
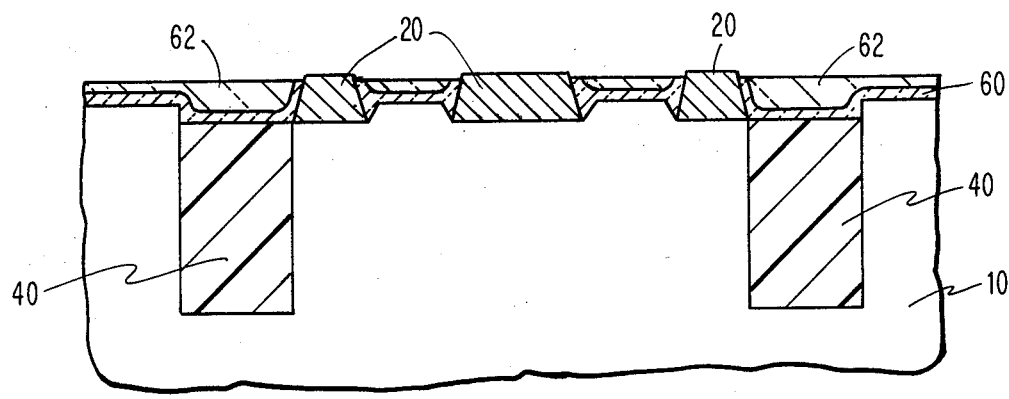

Additional process steps can be utilized to seal off the dielectric trench material from ambient conditions. FIG. 6 depicts a composite structure obtained by plasma deposition of a nitride layer 60 over the dielectric-containing surface of the structure shown in FIG. 5. After plasma deposition of the nitride layer 60, planar sputtered oxide 62 is deposited over the surface of the nitride layer 60. Subsequent etchback of the sputtered oxide layer 62 provides exposure of the conductive layer pattern 20 and planarization of the oxide layer 62 as shown in FIG. 7. Thus, the dielectric has been encapsulated as the trench isolation material, without exposure to potentially detrimental lift-off solvents and the integrity of the dielectric has been maintained.

The following is a detailed example for preparation of a semiconductor structure containing a dielectric trench isolation material which has been sealed off from ambient conditions.

EXAMPLE

An 82 μm silicon wafer was processed to provide the desired surface contours and platinum silicide formation in contact areas. A layer of poly(methyl methacrylate) (PMMA) underlay material was applied in order to fill the approximately 6 micron deep isolation contours (trench) in the substrate and produce a roughly planar film about 2 to 3 microns thick over the surface of the semiconductor structure in general. The underlay material was applied using standard solution coating techniques. A first layer of the PMMA solution was applied via spin coating, following by an oven bake at about 200° C. to obtain solvent removal. A second layer was then applied in the same manner followed by a second oven bake.

Subsequently, a dry-etch barrier of HMDS about 0.2 microns thick was plasma deposited on the surface of the PMMA. A photo imaging layer of AZ (diazoquinone-novolak) positive resist was then formed over the HMDS using standard photolithographic techniques.

The resultant structure was that shown in FIG. 1 wherein a portion of the silicon structure 10 containing trenches 14 had been coated with PMMA underlay material 12 to fill the trenches and provide a coating over the upper surface of the silicon substrate in general. The dry-etch barrier layer of HMDS 16 had been applied over the PMMA surface, and the imaged AZ photo resist layer 18 provided a mask for subsequent processing operations.

Once the imaged AZ photo resist layer was in place on the surface of the HMDS layer, the lift-off pattern to be used for deposit of the conductive pattern was created by using sequential reactive ion etching by $CF_4$ and then oxygen etching to remove portions of the HMDS layer, PMMA underlay material, respectively (and concurrently substantially all of the protective AZ photo imaging layer).

A 1.4 μm layer of Cr/Al/Cu 20 was then applied, after which the lift-off structure was removed. To accomplish the lift-off, the structure was heated to about 300° C. to promote depolymerization of the PMMA underlay material. Depolymerization was followed by an acetone rinse to remove any residue. The resultant structure after lift-off is shown in FIG. 3, wherein the conductive Cr/Al/Cu pattern was properly located on the silicon structure 10 and isolated from other areas of the structure 10 via trenches 14.

An amino silane coupling agent was applied to the semiconductor substrate, and the trenches 14 were subsequently filled using two solution coating applications of Skybond 703 polyimide. The skybond 703 was dissolved in NMP to provide a 5:3 dilution, respectively. Each application of solution coating was followed sequentially by a 10 minute bake on an 88° C. hot plate and a 10 minute bake in a 200° C. oven. The second application was also subjected sequentially to a bake in a nitrogen-purged oven for 30 minutes at 300° C. followed by 30 minutes at 400° C., to provide for cure and planarization of the polyimide.

FIG. 4 shows the composite structure after processing, wherein the Skybond 703 polyimide 40 filled the trenches 14 of the silicon structure 10 and covered the Cr/Al/Cu conductive pattern 20.

After final cure of the polyimide, oxygen RIE (reactive ion etching) was used to etch the polyimide 40 back to the surface of the trenches 50, exposing the conductive pattern 20 as shown in FIG. 5. A 300° C. bake of the structural composite shown in FIG. 5 was used to eliminate moisture from the polyimide.

In order to seal off the trench material from ambient conditions and prevent future moisture pick up by the polyimide, a plasma nitride deposition 60 ranging between 0.2 and 0.3 μm was made over the entire surface of the composite, as shown in FIG. 6. Planar sputtered silicon dioxide 62 was then deposited over the plasma nitride deposition 60. $CF_4$ RIE followed by argon sputtering was subsequently used to expose the conductive Cr/Al/Cu pattern 20 as shown in FIG. 7 and to polish and planarize the surface of the composite structure, respectively.

The above description presents the best mode contemplated for carrying out the present invention. The invention is, however, susceptible to modifications in terms of materials used and process conditions, some of which are described in this specification in more general terms. Consequently it is not intended to limit this invention to the particular embodiment disclosed. On the contrary, the intent is to cover all modifications and alternate constructions falling within the spirit and scope of the invention as expressed in the appended claims.

What is claimed is:

1. A method of preparing a semiconductor structure wherein segments of conductive patterns are isolated by trenches filled with polymeric dielectric materials, comprising:
   (a) filling said trenches of said semiconductor structure with a removable polymeric underlay;
   (b) performing intermediary processing steps upon said semiconductor structure;
   (c) removing said polymeric underlay from said trenches; and
   (d) refilling said trenches with a permanent polymeric dielectric material.

2. The method of claim 1 wherein said semiconductor structure segments comprise an integrated circuit, having circuit elements thereof contacted with said conductive pattern.

3. The method of claim 1 wherein said polymeric underlay comprises a material selected from the group consisting of polysulfone, polymethyl methacrylate, poly(α-methylstyrene) and diazoquinone-novolak compositions.

4. The method of claim 3 wherein the dielectric of step (d) is selected from the group consisting of polyimides and polymerizable oligomers wherein said oligomers are selected from the group consisting of polyamic acid, the corresponding amic ester, the corresponding isoimide, the corresponding imide and mixtures thereof, wherein the end groups of said polymerizable oligomers are end-capped with a vinyl or acetylinic end group.

5. A method of preparing semiconductor structures which utilize trenches filled with polymeric dielectric materials to isolate segments thereof, comprising:
   (a) coating said semiconductor structures and concurrently filling said trenches thereof with a layer of a removable lift-off polymeric underlay;
   (b) forming a dry-etch barrier film over said polymeric underlay;
   (c) forming a mask/imaging layer over said barrier film, with said mask layer having a pattern of openings defining a desired conductive pattern;
   (d) sequentially dry etching through said openings of said mask, said barrier film, and said polymeric underlay to the surface of said semiconductor structure with concurrent substantially complete removal of said mask;
   (e) depositing a blanket layer of conductive material over any remaining mask/imaging layer, said barrier film and upon the exposed surfaces of said semiconductor structure;
   (f) removing said polymeric underlay from said semiconductor structure and said trenches; and
   (g) filling said trenches and concurrently coating said semiconductor structure with a dielectric composition.

6. The method of claim 5 including the additional step of:
   (h) planarizing said dielectric composition to a level even with the surface of said semiconductor structure surrounding said trenches and simultaneously exposing said conductive pattern upon other portions of said semiconductor structure.

7. The method of claim 6 including the additional steps of:
   (i) blanket coating said semiconductor structure and the conductive pattern thereon with silicon nitride film;
   (j) blanket coating said silicon nitride film with a layer of a silicon dioxide dielectric to a level above said conductive pattern; and
   (k) planarizing said silicon dioxide layer and said silicon nitride film by dry etching thereof to a level exposing the top surface portions of said conductive pattern.

8. The method of claim 6 including the additional step of:
   (i) baking the composite of step (h) at about 300° C. to eliminate moisture from the dielectric.

9. The method of claim 8 including the additional steps of:
   (j) blanket coating said semiconductor structure and the conductive pattern thereon with silicon nitride film;
   (k) blanket coating said silicon nitride film with a layer of a silicon dioxide dielectric to a level above said conductive pattern; and
   (l) planarizing said silicon dioxide layer and said silicon nitride film by dry etching thereof to a level exposing the top surface portion of said conductive pattern.

10. The method of claim 5 wherein said polymeric underlay comprises a material selected from the group consisting of polysulfone, polymethyl methacrylate, poly(α-methylstyrene) and diazoquinone-novolak compositions.

11. The method of claim 10 wherein said barrier film is selected from the group consisting of organosilicate glasses, hexamethyldisilizane and divinylstyrene.

12. The method of claim 11 wherein the dielectric of step (g) is selected from the group consisting of polyimides and polymerizable oligomers wherein said oligomers are selected from the group consisting of polyamic acid, the correspoding amic ester, the corresponding isoimide, the corresponding imide and mixtures thereof, wherein the end groups of said polymerizable oligomers are end-capped with a vinyl or acetylinic end group.

13. A method of preparing semiconductor structures which utilize trenches filled with polymeric dielectric materials to isolate segments thereof, comprising:
   (a) coating said semiconductor structure and concurrently filling said trenches thereof with a layer of a removable lift-off polymeric underlay;
   (b) forming a mask/imaging layer over said polymeric underlay, with said mask layer having a pattern of openings defining a desired conductive pattern;
   (c) etching via said mask openings through said polymeric underlay to the surface of said semiconductor structure;
   (d) depositing a blanket layer of conductive material over said mask layer and on the exposed surfaces of said semiconductor structure;
   (e) removing said polymeric underlay from said semiconductor structure and said trenches;
   (f) filling said trenches and concurrently coating said semiconductor structure with a dielectric composition; and
   (g) planarizing said dielectric composition to a level even with the surface of said semiconductor structure surrounding said trenches and simultaneously exposing said conductive pattern upon other portions of said semiconductor structure.

14. The method of claim 13 wherein said semiconductor structure segments comprise and integrated circuit, having circuit elements thereof contacted with said conductor pattern.

15. The method of claim 13 including the additional steps of:
   (h) blanket coating said semiconductor structure and the conductive pattern thereon with silicon nitride film;
   (i) blanket coating said silicon nitride film with a layer of a silicon dioxide dielectric to a level above said conductive pattern; and
   (j) planarizing said silicon dioxide layer and said silicon nitride film by dry etching thereof to a level exposing the top surface portion of said conductive pattern.

16. The method of claim 13 including the additional step of:
   (h) baking the composite of step (g) at about 300° C. to eliminate moisture from the dielectric.

17. The method of claim 16 including the additional steps of:
   (i) blanket coating said semiconductor structure and the conductive pattern thereon with silicon nitride film;
   (j) blanket coating said silicon nitride film with a layer of a silicon dioxide dielectric to a level above said conductive pattern; and (k) planarizing said silicon dioxide layer and said silicon nitride film by dry etching thereof to a level exposing the top surface portion of said conductive pattern.

18. The method of claim 13 wherein said polymeric underlay comprises a material selected from the group consisting of polysulfone, polymethyl methacrylate, poly(α-methylstyrene) and diazoquinone-novolak compositions.

19. The method of claim 18 wherein the dielectric of step (f) is selected from the group consisting of polyimides and polymerizable oligomers, wherein said oligomers are selected from the group consisting of polyamic acid, the corresponding amic ester, the corresponding isoimide, the corresponding imide and mixtures thereof, and wherein the end groups of said polymerizagle oligomers are end-capped with a vinyl or acetylinic end group.

* * * * *